United States Patent [19]
Yasuda et al.

[11] Patent Number: 4,891,524
[45] Date of Patent: Jan. 2, 1990

[54] CHARGED PARTICLE BEAM EXPOSURE SYSTEM AND METHOD OF COMPENSATING FOR EDDY CURRENT EFFECT ON CHARGED PARTICLE BEAM

[75] Inventors: Hiroshi Yasuda, Yokohama; Masahiko Suzuki, deceased, late of Aichi, both of Japan, by Yoshikazu Suzuki, Fumie Suzuki, heirs

[73] Assignee: Fujitsu Limited, Kawasaki, Japan

[21] Appl. No.: 243,274

[22] Filed: Sep. 12, 1988

[30] Foreign Application Priority Data

Sep. 16, 1987 [JP] Japan .................................. 61-231804

[51] Int. Cl.$^4$ ............................................ H01J 37/04
[52] U.S. Cl. .............................. 250/398; 250/396 ML
[58] Field of Search ............. 250/396 ML, 398, 492.2, 250/492.21

[56] References Cited

U.S. PATENT DOCUMENTS

| | | | |
|---|---|---|---|
| 3,922,546 | 11/1975 | Livesay | 250/398 |
| 4,125,772 | 11/1978 | Holmes | 250/396 ML |
| 4,251,728 | 2/1981 | Pfeiffer et al. | 250/356 ML |
| 4,362,942 | 12/1982 | Yasuda | 250/398 |
| 4,468,565 | 8/1984 | Blair et al. | 250/492.3 |
| 4,544,846 | 10/1985 | Langer et al. | 250/396 ML |
| 4,701,623 | 10/1987 | Beasley | 250/398 |

FOREIGN PATENT DOCUMENTS 0148784 7/1985 European Pat. Off. .

OTHER PUBLICATIONS

Journal of Vacuum Science & Technology B, Microelectronics Processing and Phenomena, vol. 5, 1987, American Vacuum Society, "A High Dose and High Accuracy Variable Shaped Electron Beam Exposure System for Quartermicron Device Fabrication", by Yoshikawa et al, pp. 70–74.

Primary Examiner—Bruce C. Anderson
Attorney, Agent, or Firm—Staas & Halsey

[57] ABSTRACT

A method for compensating for an eddy current effect due to leakage flux of a magnetic lens in a charged particle beam exposure system, and a system for exposing the beam on a substrate while a stage carrying the substrate is moving. By employing this method and system, a step and repeat system can be operated while the stage is moving, while improving the throughput of the system. A deviation in the path of the charged particle beam caused by the eddy current is proportional to the velocity of the stage. To compensate for this, a proportional constant relating the deviation to the velocity of the stage is measured in advance, and a correction term which is a product of the speed of the stage and the proportional constant, is fed back to a deflector of the charged particle beam. The proportional constant is obtained from a shift of an image of a test pattern viewed on a CRT in a SEM mode, from a first position at which the stage is stationary to a second position while the stage is moving at a constant speed.

20 Claims, 4 Drawing Sheets

CHARGED PARTICLE BEAM EXPOSURE SYSTEM AND METHOD OF COMPENSATING FOR EDDY CURRENT EFFECT ON CHARGED PARTICLE BEAM

BACKGROUND OF THE INVENTION

The present invention relates to a charged particle beam exposure system, and especially to a method and apparatus of compensating for distortion caused by an eddy current induced by leakage flux of a magnetic lens.

Electron beam exposure and ion beam implantation apparatus are widely used in modern semiconductor manufacturing. As the integration scale becomes large in an integrated circuit (IC), requirements for fine patterning on a large area increase. Since it is difficult to maintain a sharply focused beam over a wide scanning area, the pattern to be exposed on a chip is divided into several fields. After one field is exposed, the stage is slid to the next field to expose the next field. In this manner, each of the fields are exposed one by one to complete the exposure over the entire pattern of the chip. The size of the field which can be scanned by the beam becomes smaller when the accuracy requirements of the pattern increase.

Recent ICs require an extremely fine pattern, so that the size of the field has become smaller to obtain the maximum sharp focusing over the entire field. On the other hand, the chip size to be exposed has become larger. For example, a pattern of a large scale integrated circuit (LSI) of $1 \times 1$ cm$^2$ size is divided into fields of $1 \times 1$ mm$^2$ size. Therefore, one hundred separate exposure are necessary for exposing one chip. This increases the time required to expose the chip and decreases the throughput of the beam exposure systems. Further, the tendency in recent LSI manufacturing is for further increases in exposure time per chip.

In order to overcome the above problem, a continuously moving stage system has been deemed necessary. This system can expose the beam over the field while the stage carrying the substrate is moving. However, a new problem has resulted from this continuous exposure system. This new problem, the eddy current problem, was not found in prior systems such as the step and repeat system, because in the step and repeat system the stage is fixed while the exposure is carried out, and the beam is cut off while the stage is moving. No eddy current occurs while the beam is exposing the substrate. Further details of the step and repeat system can be found, for example, in U.S. application Ser. No. 689,010, filed on Jan. 4, 1985, by H. Yasuda et al.

There are systems in which the stage is moved while the electron beam is irradiating the substrate to expose a large pattern. In such continuous exposure systems, the problem of eddy current is not so serious, because in such systems, the bore of the magnetic lens through which the electron beam is projected is designed to be small to reduce the leakage flux as much as possible. Further, the focal length of the magnetic lens can be chosen longer than that of the step and repeat system, so that a working distance, i.e., a gap between the lens and the stage, is large. Accordingly, the leakage flux at the position of the stage is not so strong. However, since the scanning field of the continuously moving system is very narrow, the throughput is not so good. Further details of the continuously exposing system can be found for example in U.S. Pat. No. 4,362,942 by H. Yasuda, or "A HIGH DOSE AND HIGH ACCURACY VARIABLE SHAPED ELECTRON BEAM EXPOSURE SYSTEM FOR QUATERMICRON DEVICE FABRICATION" by R. Yoshikawa et al., J. Vac. Technol. B5 (1), Jan./Feb. 1987, American Vacuum Society.

If the stage in the step and repeat system is moved while the beam is exposing the substrate, the problem of eddy current occurs, because the bore of the magnetic lens is made large to obtain a wide scanning field, and the working distance is short compared to that of the continuously moving exposure system in order to maintain the high resolution. Therefore, the leakage flux from the magnetic lens cannot be neglected, and a deviation in the path of the electron beam is caused by the eddy current.

SUMMARY OF THE INVENTION

It is an object of the invention, therefore, to provide a method to overcome the deviation in the path of the charged particle beam caused by an eddy current due to leakage flux from a magnetic lens in a charged particle beam exposure system.

Another object of the present invention is to improve the charged particle beam exposure system so that it can irradiate the beam on the substrate carried by a moving stage and having a much wider scanning field than conventional continuously moving exposure systems. The scanning field of the present invention is comparable to that of a step and repeat system.

A further object of the present invention is to increase the throughput of a charged particle beam exposure system.

Deviation in the path of a charged particle beam caused by the eddy current varies at each point on the stage, and depends on the speed and direction of movement of the stage carrying the substrate. However, once the configuration of the stage is determined, the proportional constant of the beam deviation versus the velocity of the stage is fixed as a specific value at each point on the stage. Therefore, in this invention, the deviation in the path of the beam at each point on the stage is measured in advance for each movement of the stage in X and Y directions, and the proportional constant of the deviation at each point on the stage is stored in a memory device. Usually, the variation of the proportional constant over the stage is very little and slight, so that in most cases it can be considered to be a constant over most of the stage.

When the exposure and movement of the stage begins, the position and velocity of the stage are measured in a real time fashion. A correction signal to compensate the beam deviation is obtained by multiplying the velocity of the stage and the proportional constant for each point on the stage. The compensation signal is superposed on the deflection signal supplied to the X and Y deflector of the beam exposure, to compensate for the effect of the eddy current.

These and other objects and advantages of the invention will become apparent from the following detailed description taken in conjunction with the accompanying drawings, wherein like reference numerals refer to like parts throughout.

BRIEF DESCRIPTION OF THE DRAWINGS

FIGS. 1(a) and 1(b) are schematic diagrams for illustrating how the eddy current appears caused by the leakage flux of a magnetic lens and movement of the stage, and the resulting disturbance in the charged particle beam, wherein FIG. 1(a) is a partial cutaway view of a portion of an electron beam exposer, and FIG. 1(b) is a cross-sectional view of the device of FIG. 1(a) along a plane defined by line A—A in FIG. 1(a), for illustrating the deviation in the path of the electron beam caused by the eddy current;

DETAILED DESCRIPTION OF THE PREFERRED EMBODIMENT

In the following, the description of the invention will be carried out with respect to electron beam exposure equipment, but it will be obvious that the scope of the invention can be easily applied to other charged particle beam apparatus such as ion beam implantation equipment.

Figure 1A:
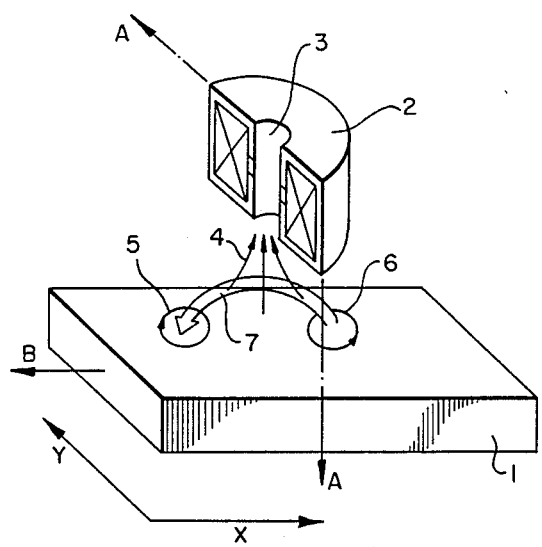

FIG 1(a) is a partially cutaway perspective view of an electron beam exposer, schematically illustrating a portion of the exposer relevant to the eddy current problem. A stage 1 carries a substrate (not shown) and is moved in X and Y directions. The stage 1 comprises various mechanisms, for example, to support it and slide it, but in FIG. 1(a) the stage 1 is represented by a metal plate for the sake of simplicity. A magnetic lens 2 focuses the electron beam (not shown) on the substrate (now shown). Usually, the magnetic lens 2 is magnetically sealed to prevent a leakage flux. However, it is impossible to seal the magnetic field off completely, because the magnetic lens is provided with a bore 3 to pass the electron beam through it. As a result, some of the magnetic field leaks out from the magnetic lens 2. In order to obtain a sharp focus of the electron beam on the substrate, the focal length of the magnetic lens 2 cannot be very long. Thus, the working distance D between the magnetic lens 2 and the stage 1 cannot be designed to be very long, and is typically about 5 mm for example. Therefore, it is impossible for the state-of-the-art technology to provide a perfect magnetic seal within the space of the working distance D to protect the stage 1 from the leakage flux.

As shown in FIG. 1(a), leakage flux 4 appears, some of which crosses stage 1. If the stage 1 moves to the left for example, as shown by an arrow B in FIG. 1(a), there appears a portion 5 on the stage 1 where the leakage flux increases, and at the same time there appears another portion 6 where the leakage flux decreases as the stage 1 moves. These changes in flux density generate an eddy current schematically shown by arrow circles at the portions 5 and 6, respectively. Since the direction of flow of the eddy currents at the portions 5 and 6 are opposite to each other, an induced magnetic flux appears from the portion 6 to the portion 5 as shown by a wide arrow 7 in FIG. 1(a). Such induced magnetic flux 7 crosses the path of the electron beam, and causes a deviation in the electron beam path.

Figure 1B:
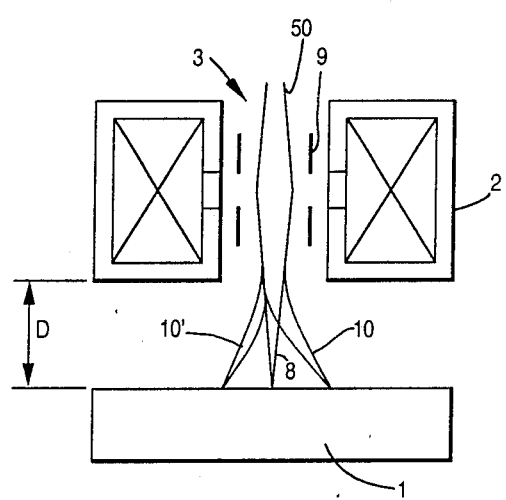

FIG. 1(b) is a schematic diagram of a cross-sectional view of the device cut along a plane defined by the line A-A in FIG. 1(a). In FIG. 1(b), when the stage 1 is stopped an electron beam 50 has a path 8. The electron beam 50 can be precisely deflected by deflectors 9. However, if in FIG. 1(b) the stage 1 is moved in a manner corresponding to the movement of the stage 1 in FIG. 1(a) (i.e., in a direction perpendicular to the sheet and extending from the sheet), the induced magnetic flux 7 (not shown in FIG. 1(b)) will also appear perpendicular to the sheet. This is consistent with arrows 7 and B in FIG. 1(a). As a result, the path of the electron beam 50 is deviated by this induced magnetic flux to follow a path 10. It will be apparent that if the stage 1 is moved in the opposite direction, the path of the electron beam 50 will be deviated to follow a path 10' in FIG. 1(b).

Such deviation in the path of the beam 50 causes error or distortion in the exposed pattern irradiated by the electron beam 50. As is evident from the above description, the deviation in the path of the electron beam 50 caused by the induced magnetic field occurs approximately in a lateral direction with respect to the movement of the stage 1, and the amount of the deviation is proportional to the moving speed of the stage 1. More precisely, such deviation in the path of the beam is not always perpendicular to the moving direction of the stage 1. Instead, it depends on the structure and material of the stage 1, the magnetic lens 2, and the energy of the electron beam 50. Once these factors are fixed, the deviation in the path of the beam from its normal position, and hence the distortion of the pattern, becomes proportional to the velocity of the stage 1. The proportional constant becomes a specific value for each point on the stage.

The above-described distortion is a new problem which never appeared in prior art step and repeat type systems where the electron beam is turned off while the stage is moved. The inventors conducted an investigation using an ordinary step and repeat type exposure system modified so that the electron beam 50 irradiates the substrate while the stage 1 is moving. The deflection of the electron beam 50 caused by the induced magnetic field due to the leakage flux of the magnetic lens in this system was almost orthogonal to the motion of the stage 1 and had a range of 0.06-0.3 $\mu$m. These values are too large to ignore for purposes of precise exposure. Thus, the inventors have determined that an ordinary step and repeat system cannot be used as a continuous exposure system.

Figure 2:
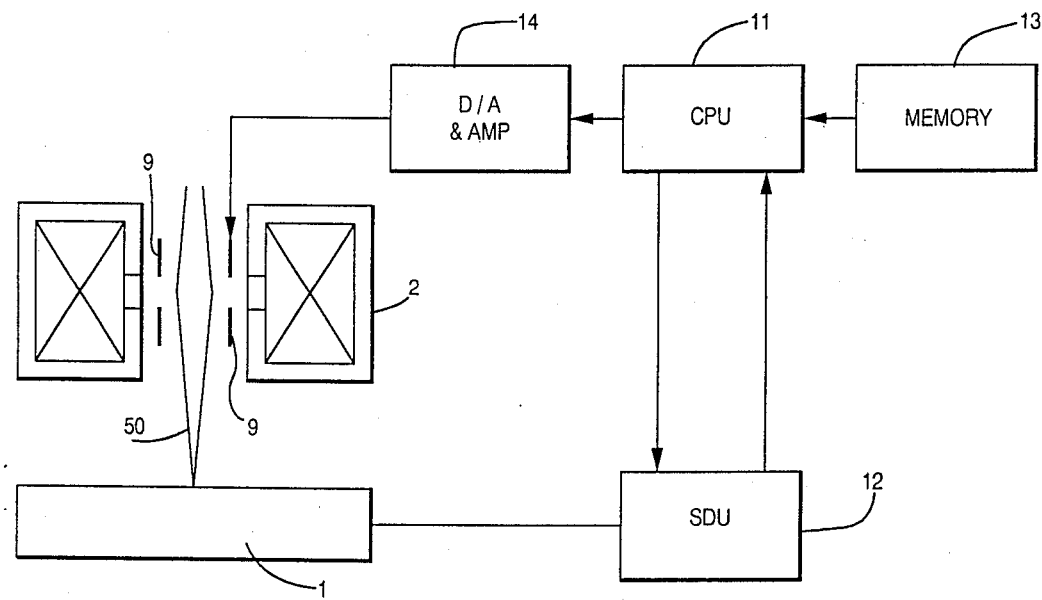
FIG. 2 is block diagram of a system which compensates for the effect of the eddy current in accordance with the present invention.

FIG. 2 is a block diagram of a system for compensating for the effect of the eddy current in accordance with the present invention. The system is controlled by a central processing unit (CPU) 11. The stage 1 is driven by a stage driving unit (SDU) 12, which drives the stage 1 in X and Y directions under the command of the CPU 11. The signals for determining the position and velocity of the stage 1 are given by the CPU 11. At the same time, the actual position and speed of the stage 1 are measured by the SDU 12 in a real time fashion, and the signals reporting these measured values are fed back from the SDU 12 to the CPU 11. In a memory device (MEMO) 13 are stored the proportional constants for the beam distortion due to the eddy current for each position on the stage 1, which are measured in advance. The deflection of the electron beam 50 also is controlled by the CPU 11 through a digital to analog converter (DAC) and amplifier (AMP) 14, as in conventional electron beam exposure systems.

When the CPU 11 receives the signals from the SDU 12 reporting the real position and speed of the stage 1, it reads out the proportional constant stored in the memory 13 corresponding to the position on the stage 1. The CPU 11 generates a correction signal which is a product of the proportional constant and the velocity of the stage 1, and the correction signal is superposed on the deflection signal which deflects the electron beam 50 when the effect of the eddy current is not compensated. The combined deflection signal which is the sum of the beam deflection signal and the correction signal, is fed to the beam deflector 9. As a result, the distortion of the electron beam due to the eddy current is corrected.

The inventors have found that in an ordinary step and repeat type electron beam exposer, there is a time lag of about 20 msec between the control signal sent out from the CPU 11 and the real motion of the stage 1. Such time lag can also be corrected by the above feedback process, because the correction is done for the actual position and speed of the stage 1 as measured in a real time fashion. The correction will become more apparent from the description of the embodiment to follow.

Figure 3:
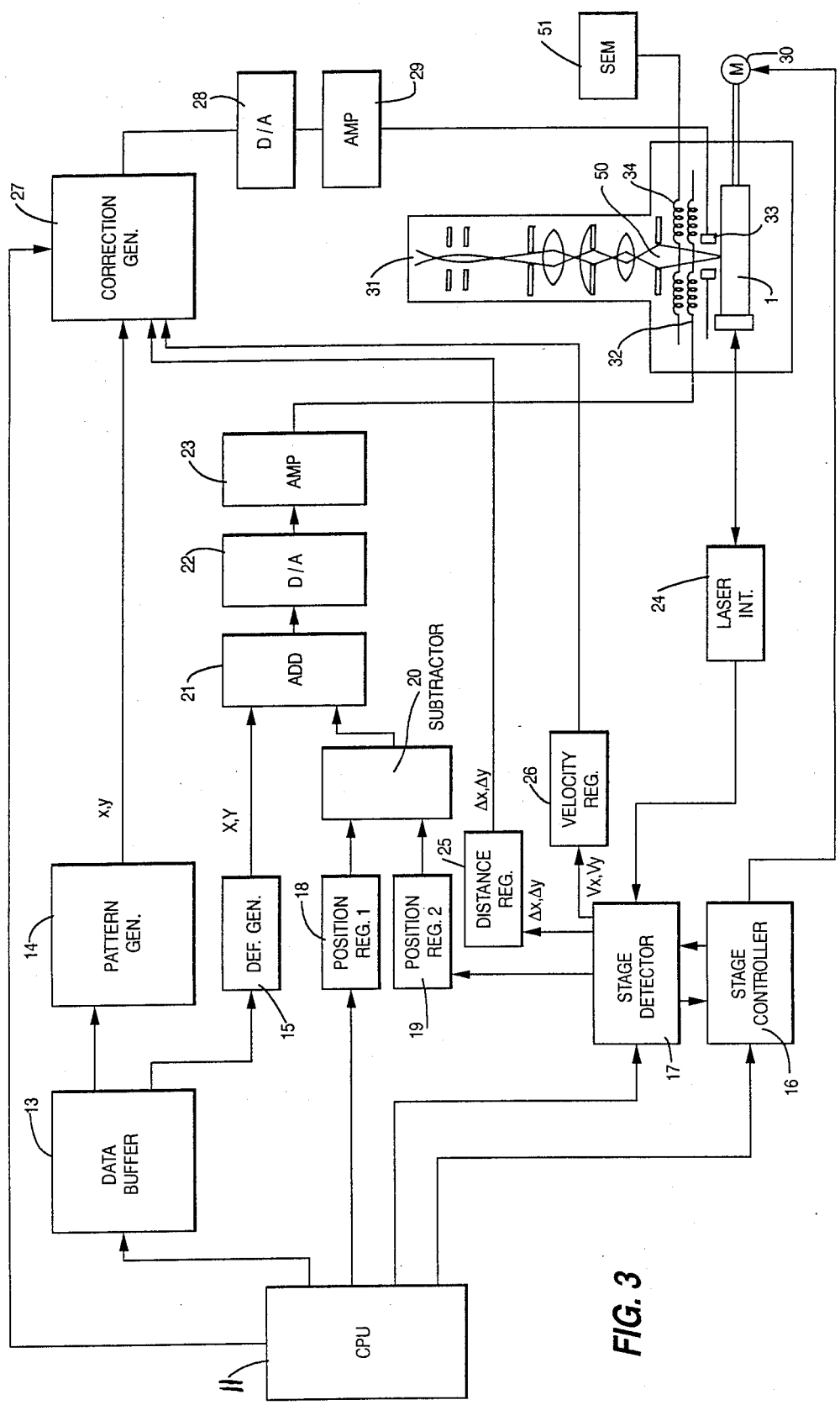
FIG. 3 is a block diagram of an electron beam exposure system with eddy current compensation in accordance with the present invention.

FIG. 3 is a circuit diagram of an embodiment of the present invention as applied to an electron beam exposer. A CPU II controls the operation of the entire system. An electron beam exposer (EBE) 31 includes a stage 1 which can move in X and Y directions while carrying a substrate (not shown). The electron beam exposer 31 comprises a main deflector 32 which mainly deflects the electron beam 50 in X and Y directions, a sub-deflector 33 which precisely deflects the electron beam independently from the main deflector 32, and a scanning electron microscope (SEM) deflector 3 which scans the electron beam 50 in a SEM mode under the control of an SEM controller 51. Recent conventional electron beam exposers are provided with these electrodes, and they are also provided with an electron source, a lens, deflecting electrodes and so on. However, since they are not directly relevant to the present invention, their description is omitted for the sake of simplicity.

In order to obtain the highest resolution and accuracy, a chip pattern is divided into a plurality of fields having a size of 2x2 mm for example, and each of the fields is further divided into a plurality of subfields having a size of 100×100 μm, for example. In an ordinary step and repeat system, the stage is moved to a field. The main reflector 32 deflects the electron beam to a subfield. The sub-deflector 33 deflects the electron beam within the subfield to project a pattern of the subfield. When exposure of the subfield is completed, the main deflector 32 deflects the beam to the next subfield. In this manner, all of the subfields in the field are exposed, and the stage 1 moves to the next field. In accordance with the present invention, the stage 1 is moved continuously while the electron beam 5 is irradiating the substrate.

First, the general operation of the system will be described with reference to FIG. 3. The stage 1 is driven by a motor 30 and moved in X and Y directions under the control of a stage controller 16, which is commanded by the CPU 11. The actual position of the stage 1 and its speed are precisely measured in a real time fashion by a stage detector 17 using a laser interferometer 24. Main deflection signals X and Y, which deflect the electron beam to a position of a subfield, and pattern signals x and y, which deflect the electron beam within the subfield to expose the pattern, are generated respectively by a deflection signal generator 15 (DEF GEN) and a pattern generator 14, with reference to position data stored in a data buffer 13, under the command of the CPU 11. These signals are respectively fed to the main deflector 32 and the sub-deflector 33, via respective digital to analog converters (DAC) 22, 28 and amplifiers (AMP) 23, 29. These controls are similar to those in ordinary step and repeat exposure systems. In the present system, however, the stage 1 is moving, so that a correction is necessary.

Before explaining compensation for the eddy current effect, the correction for the moving stage will be described. This is done by two types of corrections as described below.

The first correction corrects for the difference between the real position of stage 1 and its expected position. The second correction is with respect to the position calculated from the command of the CPU 11 indicating where the stage 1 should be positioned. Such difference occurs due to mechanical tolerance, time lag of the system, hysteresis, etc. The expected position data of the stage 1 is sent out frequently from the CPU 11, and stored in a first position register 18. At the same time, the real position data sent out from the stage detector 17 is stored in a second position register 19. The difference data between these two position data are calculated in a subtractor 20, and the output of the subtractor 20 is fed to an input terminal of an adder 21. To another input terminal of the adder 21 are supplied the main deflection signals X and Y (which are digital signals) sent from the deflection signal generator 15. These two signals are added by the adder 21 to obtain a real deflection signal which is corrected by the difference between the real position and the expected position of the stage 1, as determined by the output of the subtractor 20. The real deflection signal is converted into an analog signal by the D/A converter 22, amplified by the amplifier 23, and supplied to the main deflector 32, to deflect the electron beam 50 to the position of a field.

The second correction is for correcting an error due to the movement of the stage 1. Though the position of the stage 1 is measured in a real time fashion, the feedback is done intermittently. In practice, the feedback occurs each time the main deflector 32 shifts the electron beam from one subfield to the next subfield. By the first correction described above, the electron beam spot will be projected on a correct position at the instant of feedback, that is at the start point of the subfield, but the beam spot will move continuously since the stage 1 is moving continuously. Accordingly, correction is necessary to compensate for such moving of the electron beam spot. This correction is performed by shifting the electron beam at the same speed as the stage 1 in the direction of movement of the stage 1, using the sub-deflector 33.

The stage detector 17 outputs velocity signals $V_x$ and $V_y$ which represent the velocity components of the stage 1 respectively in the X and Y directions. These velocity signals are obtained from the time derivative of the position signal, and are written in a velocity register 26. The stage detector 17 also outputs distance signals $\Delta x$ and $\Delta y$ which respectively represent the distance of movement of the stage I in the X and Y directions, during the time period from the previous feedback to the present instant. If the stage 1 moves at a constant speed, the values of Δx and Δy increase constantly with time. The values of Δx and Δy are written in a distance register 25, and are rewritten each time new values are sent out from the stage detector 17. Using these data, the second correction is performed in the correction generator 27, and the correction signal is supplied to the sub-deflector 33, via the D/A converter 28 and the AMP 29.

Figure 4:
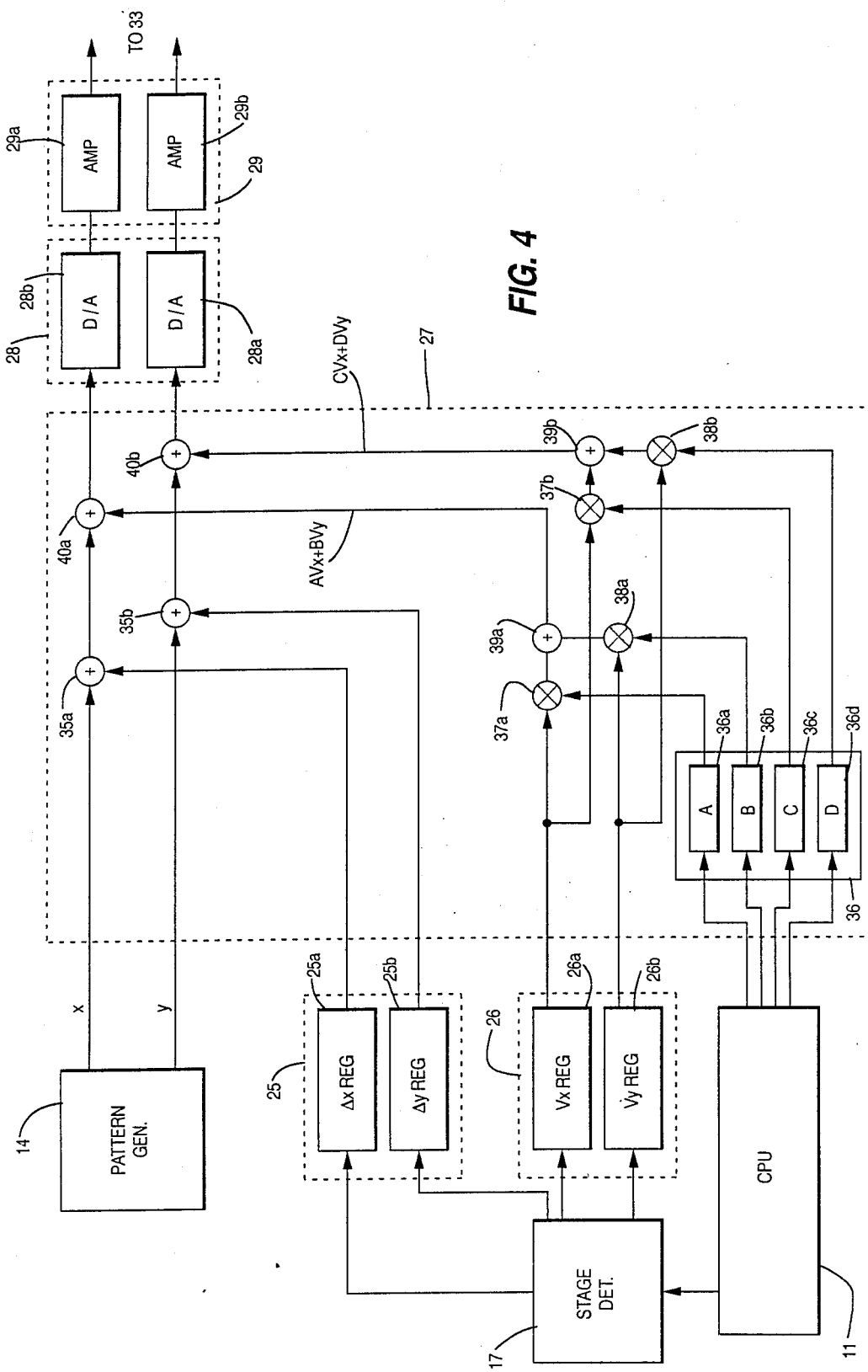
FIG. 4 is a detailed circuit diagram of the correction generator circuit 27 of FIG. 3 and its connection to other portions of the system.

FIG. 4 illustrates details of the correction generator 27 in FIG. 3 and its connection to the circuit of FIG. 3. In this correction generator 27, the second correction described above, and the correction for the eddy current are done simultaneously. In the foregoing description, the main deflector 32, sub-deflector 33 and their related wirings were described as single units for the sake of simplicity. In practice, they are composed of pairs of deflectors which respectively operates in X and Y directions, so that the circuit is composed of a pair of circuits each handling the deflections X or Y directions respectively. FIG. 4 illustrates the separate circuits.

As has been described before, the electron beam is deflected to a subfield by the main deflector 9. The pattern generator 14 generates a set of pattern signals x and y, which deflect the beam to a point (x, y) in the subfield to generate a pattern. Each time the pattern signals x and y are sent out from the pattern generator 14, the distance signals Δx and Δy are read out simultaneously from respective distance registers 25a, 25b and respectively added to the pattern signals x, y by adders 35a, 35b. It will be understood that, by this operation, the electron beam on the substrate is shifted in the direction of movement of the stage 1 with the same speed as the stage 1. Therefore, the relative movement of the beam spot on the substrate due to the movement of the stage 1 is cancelled. This is the second correction described above.

The correction for the eddy current is done as follows. Since, as has been described above, the deflection of the electron beam due to the eddy current is proportional to the velocity of the stage 1, δx, δy, the deflection of the electron beam caused by the eddy current in the X and Y directions can be expressed as $$\delta x = A \cdot V_x + B \cdot V_y \quad (1)$$

$$\delta y = C \cdot V_x + D \cdot V_y \quad (2)$$

where, A, B, C and D are proportional constants. These proportional constants are determined by experiment beforehand, and stored by the CPU 11 in the memory 13 (FIG. 2). These values are specific for each stage and magnetic lens. Therefore, once these values are determined, they can be used as a specific constant for the electron beam exposer. Theoretically, the values of A, B, C and D may vary at each position on the stage 1. However, in practice the variation of these values is very slight and small over the stage 1. As a result, in most cases, especially over the small area of the field, these values can be treated as a constant.

The CPU 11 sends out the values of the constants A, B, C and D for the respective positions on the stage, and stores them in respective registers 36a-36d. At the same time, the stage detector 17 outputs the velocity signals $V_x$, $V_y$, and stores them in respective velocity registers 26a and 26b. These operations are done under the command of the CPU 11. Usually, the stage 1 is moved at a constant speed, so that $V_x$ and $V_y$ are constant values unless the speed is varied. The values of A and $V_x$ are taken out from respective registers 26a, 36a, and multiplied by a first multiplier 37a to determine $A \cdot V_x$. Similarly, the values of B and $V_y$ are multiplied by a second multiplier 38a to obtain the value of $B \cdot V_y$. These values ar added by a first adder 39a to obtain the value of $(A \cdot V_x + B \cdot V_y)$. Similarly, the value $(C \cdot V_x + D \cdot V_y)$ is obtained by another pair of first and second multipliers 37b, 38b and another first adder 39b. Those values are the correction factors of equations (1) and (2). The pattern signals which are corrected by the second correction in the adders 35a, 35b, are respectively further added to the correction factors $(A \cdot V_x + B \cdot V_y)$ and $(C \cdot V_x + D \cdot V_y)$ by second adders 40a, 40b, and sent to respective D/A converters 28a, 28b and fed to X and Y subdeflectors via respective amplifiers 29a and 29b. In this manner, the second correction and the correction for the eddy current are done simultaneously in the correction generator circuit 27.

Figure 5:
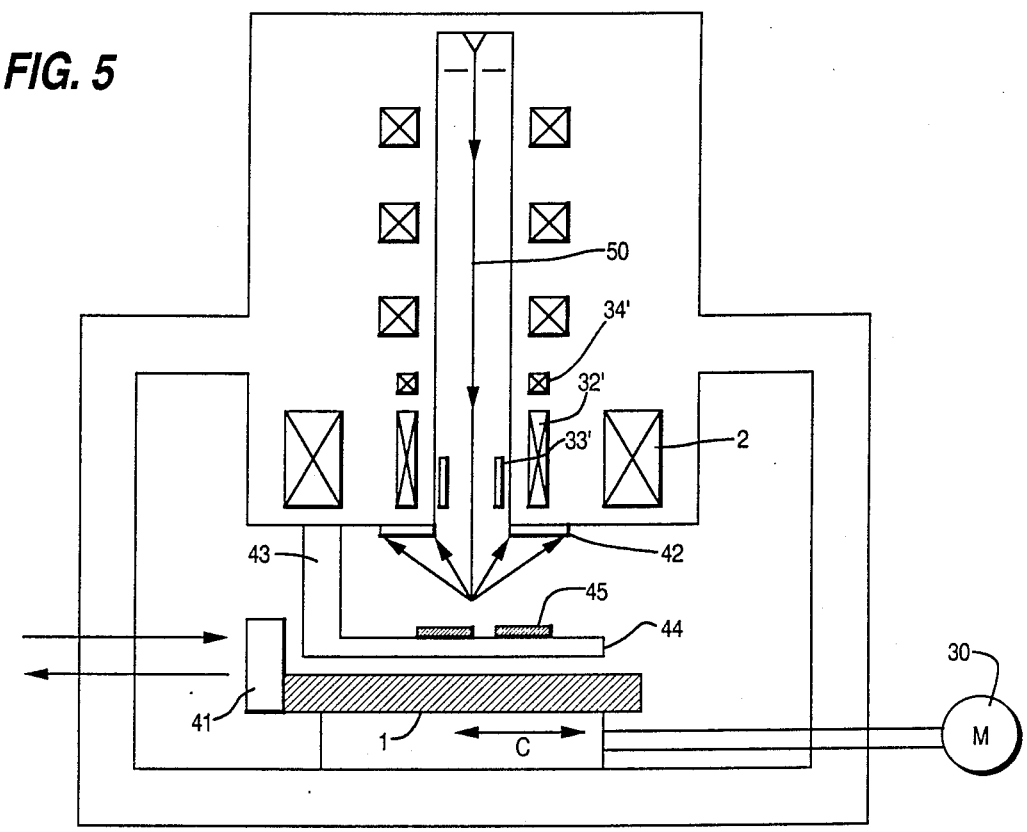
FIG. 5 is a schematic diagram of a portion of an electron beam exposer, which is used to illustrate a method for measuring the effect of an eddy current.

The determination of the proportional constants A, B, C and D based on experiment is described below. FIG. 5 shows a partially enlarged schematic cross-sectional view of an electron beam exposer having an attachment for measuring the effect of eddy current. The stage 1 is driven in X and Y directions by a motor 30. The X direction is shown by an arrow C in the figure, while the Y direction is perpendicular to the surface of the sheet. At one edge of the stage 1 is provided a mirror 41 which reflects the laser beam from the laser interferometer 24 (see FIG. 3) to give information on the real position of the stage 1. Though they are not shown, the stage 1 is provided with a similar mirror and laser interferometer for the Y direction. The electron beam exposer 31 is provided with a magnetic lens 2, main deflector coils 32', sub-deflector electrodes 33', and SEM deflector coils 34'. Description of the other parts of the electron beam exposer is omitted for the sake of simplicity.

Recent electron beam exposers are usually provided with a reflected electron detector 42 which is a kind of semiconductor diode for detecting reflected electrons of the incident electron beam 50 or secondary electrons generated by the incident electron beam 50. One feature of the electron beam exposer used for this embodiment of the present invention is that it is provided with a support arm 43 to support a test substrate 44 in parallel with the stage 1. The support arm 43 is made of non-magnetic material, and is detachably fixed to the body of the electron beam exposer 31 The design of the support arm 43 may be of any shape, but it is devised to support the test substrate 44 in parallel with, and as close as possible to, the top surface of the stage 1. In practice, a gap of about 1 mm between the test substrate 44 and the top surface of the stage is allowable, without hindrance to the measurement described below. By this support arm 43, the test substrate 44 is fixed against the body of the electron beam exposer 31 or the magnetic lens 2, regardless of the motion of the stage 1.

Figure 6:
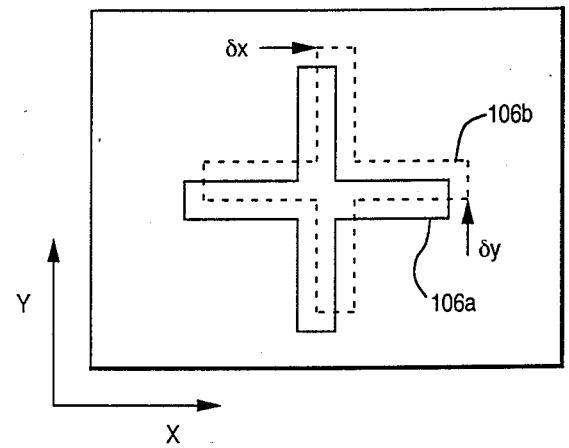
FIG. 6 shows an example of a test pattern used for measuring the effect of an eddy current.

Using the SEM deflector coils 34', the electron beam 50 is scanned over the test substrate 44 in a scanning electron microscope mode under the control of the SEM controller 51 (FIG. 3). On the test substrate 44 is formed a test pattern 45, one example of which is shown in FIG. 6 by a solid line 106a. In this example, a test pattern 45 of a cross mark for instance, is formed with gold, for example, over the surface of the test substrate 44, which is made of silicon for example. The width of each branch of the cross mark is 5 μm, and the length of each is 20 μm for example. The branches are respectively aligned in X and Y directions. Since there is a difference in electron beam reflectivity between the substrate and gold, the quantity of reflected electrons (the scattered electrons and secondary electrons are all included therein) collected by the reflected electron collector 42 varies in dependence upon whether the electron beam 50 is irradiating the test pattern 45 or not. Therefore, if the signal taken out from the reflected electron detector 42 is fed to a brightness control terminal of a CRT (cathode ray tube) display device (not shown), and the scanning of the CRT is synchronized to the SEM mode scanning of the electron beam exposer, an image of the test pattern 45 appears on the CRT. This is similar to viewing the test pattern by a scanning electron microscope.

Assume FIG. 6 is an image of a pattern appearing on the CRT. The magnification of the pattern is adjusted to show the image properly on the CRT by adjusting the amplification factor and scanning width of the electron beam 50. When the stage 1 is not moved, the eddy current does not appear, and the image of the pattern appears in the manner shown by the solid line 106a in FIG. 6. When the stage 1 is moved, the eddy current appears on the stage 1, and it deflects the incident electron beam 50. As a result, the image on the CRT is shifted as shown by a broken line 106b in FIG. 6, though the test substrate 44 is not moved with the stage 1. The shift of the image on the CRT varies with the speed and direction of the movement of the stage 1. The shift of the image becomes large at edge portion of the stage 1, but over most of the stage 1, the variation of the shift is very small and slight. Especially over a small area of a scanning field for example, the shift can be considered to be almost constant, so long as the velocity of the stage 1 is constant.

If the stage 1 is moved in the X direction, the image of the pattern on the CRT shifts mainly in the Y direction as shown in FIG. 6. This is because, as explained before with reference to FIG. 1, the incident electron beam 50 is bent almost laterally to the movement of the stage 1. Such shift of the beam spot caused by the eddy current can be measured easily on the CRT because the size of the test pattern is known. Let the displacement of the image in the X and Y directions be $\delta x$ and $\delta y$, respectively when the stage is moved in the X direction at a constant speed Vx. Then the proportional constants A and C in the equations (1) and (2) can be obtained respectively by $$A = \delta x / V_x \quad (3)$$

$$C = \delta y / V_x \quad (4)$$

Similarly, the proportional constants B and D can be obtained from the displacement of the image $\delta x'$ and $\delta y'$ (not shown) when the stage is moved in the Y direction at a constant speed $V_y$ by $$B = \delta x' / V_y \quad (5)$$

$$D = \delta y' / V_y \quad (6)$$

The proportional constants A and D are very small compared to B and C, and the variations in A, B, C, D are very slight and small over a wide area of the stage 1 Therefore, they can be considered as constants over the small scanning field of the electron beam 50. If these values at each portion of the stage are stored in a memory, the CPU 11 can use them to generate correction signals for cancelling the effect of the eddy current on the electron beam. The velocities $V_x$ and $V_y$ of the stage 1 are varied according to the operation of the system, but the values of A, B, C, D do not vary, so that they remain a specific constant for the stage and magnetic lens.

It should be pointed out that in order to apply these proportional constants to the circuits of FIGS. 3 and 4, negative values, that is $-A$, B, $-C$, $-D$, should be used, in order to compensate for the deflection of the beam spot due to the eddy current.

A more practical and easy way to obtain the proportional constants A, B, C, D will be described below. Referring back to FIG. 4, it is possible to manually set values of A, B, C, and D in the registers 36a–36d using a command of the CPU 11. Watching the image of the test pattern on the CRT operated in SEM mode, the stage 1 is moved in the X direction at a constant speed $V_x$, e.g., 50 mm/sec. The image is displaced. Then if a value is set in the register C, the image is shifted back to some extent in the Y direction. In this manner, by varying the setting value of the C register, the image on the CRT can be brought to the original position where the stage is not moved. The value set in the C register at this time is the required value of the proportional constant C at that position of the stage 1. By adjusting the setting value to compensate for the shift in the image in the X direction, the value of A is obtained. Similarly, the values of B and D are obtained by moving the stage 1 in the Y direction at a constant speed $V_y$.

As has been described above, the effect of eddy current due to the movement of the stage 1 can be compensated. Thus, it becomes possible to expose the pattern accurately while the stage 1 is moving. This improves the throughput of the electron beam exposure system. The compensating method of the present invention has been explained with respect to an electron beam exposure system, but it will be obvious that the invention can be applied to any charged particle beam exposure system. Further, the method described above may be modified in various ways, for example, the compensation feedback can be done using the main deflector, the measurement of position or speed of the stage can be done in various ways, and the circuit shown in FIG. 4 may be varied while retaining the same feedback effect on the deflection coils. Those modifications are all considered to be within the scope of the invention.

What is claimed is:

1. A method for compensating for an eddy current effect in a charged particle beam exposure system, the eddy current effect being due to leakage flux of a magnetic lens and motion of a stage carrying a substrate on which a focused charged particle beam is irradiated while the stage is moving at a velocity, the charged particle beam being deflected in first and second directions in accordance with pattern signals to deflect the charged particle beam to a position on a pattern, said method comprising the steps of:
   (a) determining proportional constants for the relationship between the deviation in the path of the charged particle beam caused by the eddy current, and the velocity of the stage, the deviation being substantially proportional to the velocity of the stage;
   (b) generating a correction signal which is a negative product of the velocity of the stage and the proportional constants; and (c) superposing the correction signal on the pattern signals, so as to correct the deviation in the path of the charged particle beam.

2. A method for compensating for an eddy current according to claim 1, wherein the proportional constants comprise four constants A, B, C, and D which are determined by the following equations:

$$\delta x = A \cdot V_x + B \cdot V_y$$

$$\delta y = C \cdot V_x + D \cdot V_y$$

where $\delta x$, $\delta y$ represent shifts of a charged particle beam spot in the first and second directions, respectively, on the substrate due to the eddy current, and $V_x$, $V_y$ are velocity components of the stage in the first and second directions, respectively, and wherein said step (a) comprises the substeps of:

(a1) supporting a test substrate having a test pattern in a position parallel to a top surface of the stage and adjacent to but separated from the stage, so that the test substrate is fixed against the magnetic lens of the charged particle beam exposer, regardless of the motion of the stage;

(a2) generating an image of the test pattern on a cathode ray tube by a scanning electron mode of operation of the charged particle beam exposer;

(a3) moving the stage in the first or second directions at a constant speed $V_x$, $V_y$ respectively; and (a4) determining the values of $\delta x$ and $\delta y$ from the shift of the image on the cathode ray tube from a first position when the stage is stationary to a second position while the stage is moving.

3. A charged particle beam exposure system for compensating for the eddy current effect caused by leakage flux of a magnetic lens and motion of a stage carrying a substrate on which a focused charged particle beam is irradiated while the stage is moving at a velocity, said system comprising:

deflecting means for deflecting the charged particle beam on a pattern in accordance with pattern signals;

detecting means for detecting the position and velocity of the stage in a real time fashion, and for generating position data and velocity data;

memory means for storing proportional constants for the relationship between the deviation in the path of the charged particle beam caused by the eddy current and the velocity of the stage, the proportional constants being measured in advance for a plurality of positions on the stage;

correction generating means for generating correction signals which are a negative product of the proportional constants and the velocity data; and feedback means for feeding back the correction signals to said deflecting means.

4. A charged particle beam exposure system according to claim 3, wherein said deflecting means comprises:

a main deflector for deflecting the charged particle beam to a selected subfield on the pattern; and a sub-deflector for deflecting the charged particle beam within the selected subfield in accordance with the pattern signals.

5. A charged particle beam exposure system according to claim 4, wherein said charged particle beam is an electron beam.

6. A charged particle beam exposure system for compensating for the eddy current effect caused by leakage flux of a magnetic lens and motion of a stage carrying a substrate on which a focused charged particle beam is irradiated while being deflected in first and second directions to form a pattern while the stage is moving, the pattern being divided into a plurality of fields, each of which is further divided into a plurality of subfields, said system comprising:

a central control unit for providing a main deflecting signal;

a stage for supporting a substrate to be exposed to the charged particle beam, said stage being movable in first and second directions;

a main deflector, coupled to said central control unit, for receiving the main deflecting signal and for deflecting the charged particle beam to one of the subfields in accordance with the main deflecting signal;

a pattern generator for generating a pair of pattern signals corresponding to part of the pattern on said subfield when the stage is not moving;

a sub-deflector coupled to said pattern generator for deflecting the charged particle beam to a position in said subfield in accordance with the pair of pattern signals respectively, which control the deflection of the charged particle beam in the first and second directions;

stage controller means for moving said stage in the first and second directions under the command of said central control unit;

stage detector means for detecting the position and velocity of said stage in a real time fashion, and for generating position data describing the position of said stage, first and second distance data respectively corresponding the distance of movement of said stage in the first and second directions during a time period from the time when the charged particle beam is deflected by said main deflector to the present time, and first and second velocity data describing the velocity of said stage; and correction generator means for generating a correction signal for correcting for the effect of movement of said stage and compensating for the eddy current effect, said correction generator means comprising:

a first adder for respectively adding the first and second distance data to the pair of pattern signals;

register means for storing proportional constants A, B, C and D;

a set of first multipliers, coupled to said register means and said stage detector means, for respectively multiplying the first velocity data by the proportional constants A and C;

a set of second multipliers, coupled to said register means and said stage detector means, for respectively multiplying the second velocity data by the proportional constants B and D;

a set of second adders, coupled to said sets of first and second multipliers, for respectively adding the output of each of said first multipliers to the output of a corresponding one of said second multipliers; and a set of third adders for respectively adding the outputs of said first adder to the outputs of said second adders.

7. A charged particle beam exposure system according to claim 6, wherein said proportional constants are determined in accordance with the following equations $$\delta x = A \cdot V_x + B \cdot V_y$$

$$\delta y = C \cdot V_x + D \cdot V_y$$

where $\delta x$ and $\delta y$ are shift quantities of charged particle beam position in the first and second directions, respectively, from its first position when said stage is not moving to a second position when the stage is moved with velocity components $V_x$ and $V_y$ corresponding to the first and second velocity data, respectively.

8. A charged particle beam exposure system according to claim 7, wherein the charged particle beam is an electron beam.

9. A charged particle beam exposure system for irradiating a substrate carried by a moving stage, comprising:
a magnetic lens for focusing the charged particle beam, said magnetic lens having a leakage flux which produces an eddy current effect;
means for providing pattern signals;
detecting means for detecting the position and velocity of the stage in a real time fashion, and for generating velocity data;
memory means for storing predetermined constants relating to a deviation in the path of the charged particle being caused by the eddy current;
correction generating means for generating a correction signal based on the predetermined constants and the velocity data, and for generating a deflection signal by adding the correction signal and the pattern signals; and
deflecting means for deflecting the charged particle beam onto the substrate in accordance with the deflection signal.

10. A charged particle beam exposure system according to claim 9, wherein said correction generating means comprises means for obtaining correction values C1 and C2 in accordance with the following equations:

$$A \cdot V_x + B \cdot V_y = C1$$

$$C \cdot V_x + D \cdot V_y = C2$$

Where A, B, C and D are the predetermined constants, where $V_x$ and $V_y$ are the velocity data and where the correction values C1 and C2 form the correction signal which is added to the pattern signals by said correction generating means.

11. A charged particle beam exposure system according to claim 10, further comprising means for obtaining the predetermined constants in accordance with the following equations:

$$\delta x = A \cdot V_x + B \cdot V_y$$

$$\delta y = C \cdot V_x + D \cdot V_y$$

where A, B, C and D are the predetermined constants, and where $\delta x$ and $\delta y$ are shift quantities of charged particle beam position in first and second directions, respectively, from a first position when the stage is stationary to a second position to which the stage is moved with velocity components $V_x$ and $V_y$ corresponding to the velocity data.

12. A charge particle beam exposure system according to claim 11, wherein said deflecting means comprises a subdeflector, coupled to said correction generating means, for deflecting the charged particle beam to a position within a subfield in accordance with the deflection signal.

13. A charged particle beam exposure system according to claim 12, further comprising:
a central control unit for providing a main deflection signal; and
a main deflector, coupled to said central control unit, for receiving the main deflection signal and for deflecting the charged particle beam to one of the subfields in accordance with the main deflection signal.

14. A charged particle beam exposure system according to claim 9, further comprising means for obtaining the predetermined constants in accordance with the following equations:

$$\delta x = A \cdot V_x + B \cdot V_y$$

$$\delta y = C \cdot V_x + D \cdot V_y$$

where A, B, C and D are the predetermined constants, and where $\delta x$ and $\delta y$ are shift quantities of charged particle beam position in the first and second directions, respectively, from a first position when the stage is stationary to a second position to which the stage is moved with velocity components $V_x$ and $V_y$ corresponding to the velocity data.

15. A charged particle beam exposure system according to claim 14, further comprising:
a central control unit for providing a main deflection signal; and
a main deflector, coupled to said central control unit, for receiving the main deflection signal and for deflecting the charged particle beam to one of a plurality of subfields in accordance with the main deflection signal.

16. A charged particle beam exposure system according to claim 15, wherein said deflecting means comprises a subdeflector, coupled to said correction generating means, for deflecting the charged particle beam to a position specified by the deflection signal in the one of the subfields to which the charged particle beam is deflected in accordance with the main deflection signal.

17. A charged particle beam exposure system according to claim 16, wherein said charged particle beam is an electron beam.

18. A method for compensating for an eddy current effect in a charged particle beam exposure system for irradiating a substrate carried by a moving stage, comprising the steps of:
(a) determining proportional constants for the relationship between a deviation in the path of the charged particle beam caused by the eddy current and the velocity of the moving stage, the deviation being substantially proportional to the velocity of the stage;
(b) generating a correction signal which is a product of the velocity of the stage and the proportional constants; and
(c) superposing the correction signal on pattern signals which identify the position on a pattern to which the charged particle beam is to be deflected, so as to correct the deviation in the path of the charged particle beam.

19. A method for compensating for an eddy current according to claim 18, wherein the proportional constants are determined by the following equations:

$$\delta x = A \cdot V_x + B \cdot V_y$$

$$\delta y = C \cdot V_x + D \cdot V_y$$

where A, B, C and D are the proportional constants, and where $\delta x$, $\delta y$ represent shifts of a charged particle beam spot due to the eddy current in first and second directions, respectively, on the substrate, and $V_x$, $V_y$ are velocity components of the stage in the first and second directions, respectively.

20. A method for compensating an eddy current according to claim 19, wherein said step (a) comprises the substeps of:
 (a1) positioning a test substrate having a test pattern in a position substantially parallel to a top surface of the stage;
 (a2) generating an image of the test pattern by operating the charged particle beam exposure system;
 (a3) moving the stage in the first and second directions at a constant speed $V_x$, $V_y$; and
 (a4) determining the values of $\delta x$ and $\delta y$ from the shift of the image from a first position when the stage is stationary to a second position while the stage is moving.

* * * * *

UNITED STATES PATENT AND TRADEMARK OFFICE
CERTIFICATE OF CORRECTION

PATENT NO. : 4,891,524
DATED : JANUARY 2, 1990
INVENTOR(S) : HIROSHI YASUDA ET AL.

It is certified that error appears in the above-identified patent and that said Letters Patent is hereby corrected as shown below:

Col. 5, line 27, "CPU II" should be --CPU 11--;
       line 35, "deflector 3" should be --deflector 34--.

Col. 6, line 66, "stage I" should be --stage 1--.

Col. 8, line 4, "ar" should be --are--;
       line 48, "31 The" should be --31. The--.

Col. 9, line 64, "stage 1" should be --stage 1.--.

Col. 10, line 9, "-A, B," should be -- -A, -B,--.

Signed and Sealed this

Fourth Day of December, 1990

*Attest:*

HARRY F. MANBECK, JR.

*Attesting Officer*      *Commissioner of Patents and Trademarks*